United States Patent
Redeker et al.

(10) Patent No.: US 6,858,265 B2
(45) Date of Patent: Feb. 22, 2005

(54) TECHNIQUE FOR IMPROVING CHUCKING REPRODUCIBILITY

(75) Inventors: Fred C. Redeker, Fremont, CA (US); Robert Steger, Cupertino, CA (US); Shijian Li, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/370,028

(22) Filed: Feb. 18, 2003

(65) Prior Publication Data

US 2003/0180459 A1 Sep. 25, 2003

Related U.S. Application Data

(63) Continuation of application No. 08/828,154, filed on Mar. 27, 1997, now abandoned.

(51) Int. Cl.[7] ............................. B05D 3/02; B05D 3/04; C23C 16/00
(52) U.S. Cl. ...................... 427/569; 427/574; 427/573; 427/579; 427/314; 427/255.28; 427/237
(58) Field of Search .............................. 427/529, 574, 427/573, 576, 579, 314, 255.28, 237

(56) References Cited

U.S. PATENT DOCUMENTS

| | | | |
|---|---|---|---|
| 4,923,715 A | 5/1990 | Matsuda et al. ............ 427/237 |
| 5,221,414 A * | 6/1993 | Langley et al. ................ 216/74 |
| 5,279,865 A * | 1/1994 | Chebi et al. ................. 427/574 |
| 5,300,460 A * | 4/1994 | Collins et al. .............. 438/712 |
| 5,315,473 A | 5/1994 | Collins et al. .............. 361/234 |
| 5,429,070 A * | 7/1995 | Campbell et al. ........ 118/723 R |
| 5,454,903 A * | 10/1995 | Redeker et al. .............. 134/1.1 |
| 5,539,179 A | 7/1996 | Nozawa et al. ........ 219/121.43 |
| 5,668,524 A * | 9/1997 | Aida et al. .................. 338/308 |
| 5,679,215 A | 10/1997 | Barnes et al. ............ 156/646.1 |
| 5,712,702 A | 1/1998 | McGahay et al. .......... 356/311 |
| 5,748,436 A | 5/1998 | Honma et al. .............. 361/234 |
| 5,811,356 A | 9/1998 | Murugesh et al. .......... 438/711 |
| 6,524,955 B2 | 2/2003 | Fukuda et al. | |

* cited by examiner

*Primary Examiner*—Michael Barr
(74) *Attorney, Agent, or Firm*—Moser, Patterson & Sheridan

(57) ABSTRACT

Method and apparatus for improving the reproducibility of chucking forces of an electrostatic chuck used in plasma enhanced CVD processing of substrates provides for pre-coating of the electrostatic chuck with a dielectric layer, such as $SiO_2$, after every chamber cleaning process. The uniform and tightly bonded dielectric layer deposited on the electrostatic chuck eliminates the need for a cover wafer over the chuck surface during the chamber cleaning and provides for more reliable gripping of wafers.

14 Claims, 4 Drawing Sheets

TECHNIQUE FOR IMPROVING CHUCKING REPRODUCIBILITY

This application is a continuation of U.S. patent application Ser. No. 08/828,154, filed on Mar. 27, 1997, now abandoned.

BACKGROUND OF THE INVENTION

1. Field of the Invention

The present invention relates to the holding of a substrate, such as a semiconductor wafer, in a vacuum processing chamber. More particularly, the invention relates to a method and apparatus for improving chucking reproducibility of substrates on electrostatic chucks.

2. Description of the Related Art

Electrostatic chucks are used to hold individual substrates on a pedestal in semiconductor processing systems. One example of an electrostatic chuck is described in co-assigned U.S. Pat. No. 5,315,473 which is incorporated herein by reference. An electrostatic chuck typically includes at least a dielectric layer and an electrode, which may be located on a chamber pedestal or formed as an integral part of the pedestal. A substrate is placed in contact with the dielectric layer, and a direct current voltage is placed on the electrode to create the electrostatic attractive force to grip the substrate. An electrostatic chuck is particularly useful in vacuum processing environments where the maximum differential pressure which can be established between the low pressure chamber environment and the surface of the pedestal is insufficient to firmly grip the substrate or where mechanical clamping of the substrate is undesirable.

Although an electrostatic chuck may be formed from as little as a single dielectric layer and an electrode, a more typical working configuration is a thin laminate member which is supported on a chamber pedestal to receive and support the substrate. The laminate member preferably includes an electrode core, preferably a thin copper member such as a mesh, which is sandwiched between upper and lower dielectric layers of an organic material such as polyimide. An adhesive such as polyamide may be used to attach the polyimide layers to the electrode core. The lower dielectric layer of the laminate member is attached directly to the upper surface of the pedestal, usually with an adhesive such as polyamide, and the upper dielectric layer forms a planar surface on which the substrate is received. To supply the high voltage potential to the electrode, a strap, formed as an integral extension of the laminate member, extends around the edge of the pedestal and connects to a high voltage connector on the underside of the pedestal.

The use of organic materials as the dielectric layer of the electrostatic chuck creates an inherent limitation in the useful life of the chuck, because organic materials, including polyimides, have a relatively low tolerance for many process gases and plasmas, particularly to oxygen and oxygen-based plasmas. Although the majority of the surface area of the dielectric portions of the dielectric chuck are protected from the plasma by the substrate, the dielectric materials usually gets exposed to the plasma over its useful life.

Repetitive plasma process and clean cycles eventually erodes the dielectric layer to the point where arcing may occur between the electrode and the plasma, which destroys the effectiveness of the electrostatic chuck. Dielectric materials other than those particularly mentioned above, may also be adversely affected by exposure to process and cleaning gases and plasmas. For example, dielectrics such as quartz and silicon dioxide are eroded by $CHF_3$ and $CF_4$ plasma environments. Likewise, chuck configurations other than those using the laminate member construction may be adversely affected by process and cleaning gases and plasmas, such that the dielectric layers thereof will be eroded to the point where an arc will form between the electrode and the plasma.

Another problem which occurs with electrostatic chucks is that a charge buildup on the surface of the chuck can occur. As a result, the griping force on the substrate is not instantaneously removed once the bias is removed. In some cases, this is a problem since a significant remnant of this force can remain for as long as 30 to 60 seconds after removal of the clamping voltage. The waiting period required for this charge to leak off before the wafer can be removed decreases the throughput of the system. If excessive force is applied to lift a wafer while the remnant charge force is still present, the wafer can be damaged.

One solution to the dechucking problem has been to dope the ceramic surface of the chuck with conductive impurities to increase the surface conductivity of the chuck. Doping of the surface enables a residual charge to move more easily between the chucking electrode and the wafer interface. This solution makes the surface condition of the chuck critical to the chucking force which is applied to the wafer. However, the surface condition and properties of the chuck can be substantially changed by exposure to process and cleaning plasmas used in a typical system chamber. This is a further problem in that deterioration of the dielectric layer results in premature release of wafers.

There remains a need for a technique for improving the reliability of chucking substrates on electrostatic chucks which eliminates the problems encountered as a result of deterioration of the dielectric layer on electrostatic chucks.

SUMMARY OF THE INVENTION

The present invention provides a method and apparatus for processing substrates in a vacuum chamber having an electrostatic chuck and eliminating a need for a cover wafer during chamber cleaning. In one aspect of the invention, reliable gripping and releasing of substrates is provided by precoating a substrate receiving surface of an electrostatic chuck with a dielectric material after each chamber cleaning process. In the precoating step, a dielectric layer, such as a $SiO_2$ layer, is deposited on the electrostatic chuck. In one embodiment, the dielectric layer is deposited over a doped ceramic surface. Preferably, the precoat layer is deposited during a chamber seasoning step which typically follows a chamber clean cycle to coat the surfaces within the chamber. The precoat layer is removed during a subsequent chamber cleaning process and is replaced after the cleaning process is completed before resuming substrate processing. The precoat layer masks any surface changes on the electrostatic chuck and provides reproducible gripping and releasing of substrates by providing a generally uniform and consistent dielectric layer across the surface of the electrostatic chuck. Precoating of the electrostatic chuck at temperatures greater than about 150° C. provides the most uniform precoat layer, and thus the most reliable gripping and releasing of wafers.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

DETAILED DESCRIPTION OF THE PREFERRED EMBODIMENT

Figure 1:
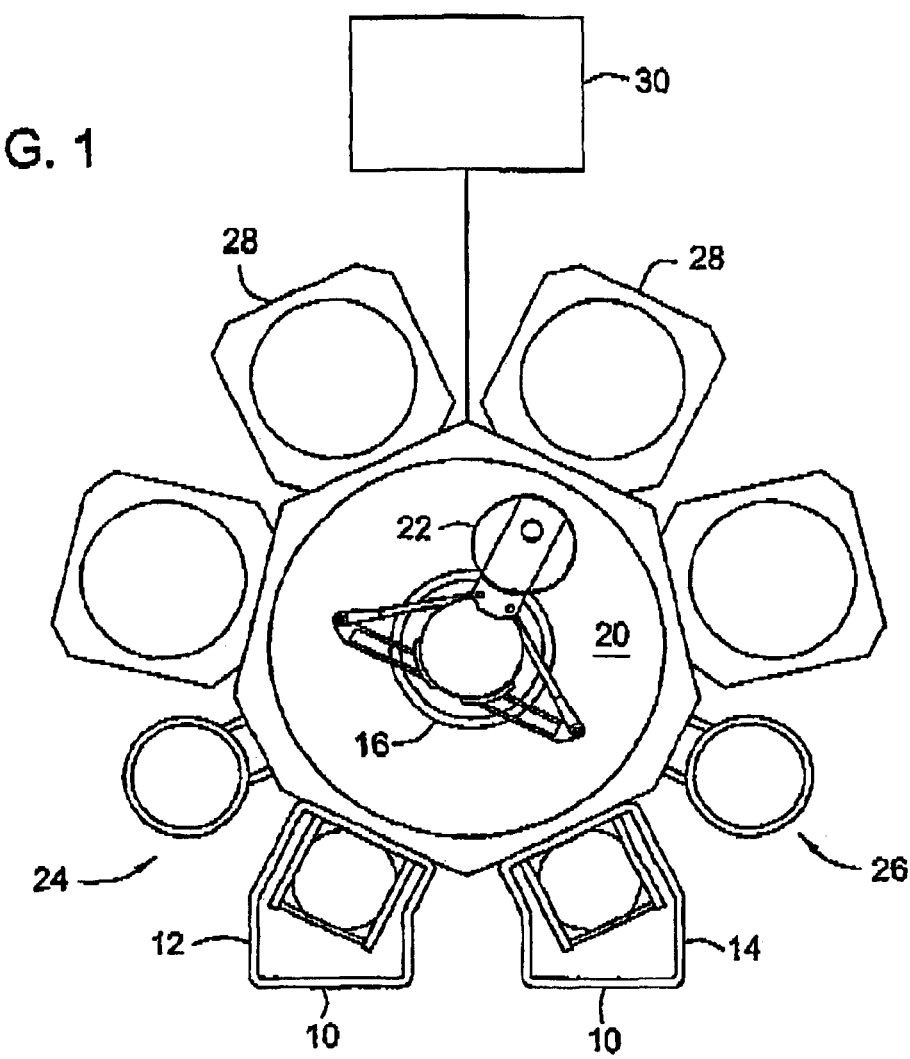
FIG. 1 is a schematic top view of a commercial wafer processing platform which is programmed to precoat an electrostatic chuck in an HDP-CVD processing chamber.

The present invention provides a method for improving operation of electrostatic chucks used to hold substrates in processing chambers. The method generally comprises depositing a layer of a dielectric material on a substrate supporting surface of an electrostatic chuck, positioning a substrate on the wafer supporting surface, and processing the substrate while held on the wafer supporting surface of the electrostatic chuck. The vacuum chamber is preferably a chemical vapor deposition chamber in which a dielectric layer can be deposited. A preferred chamber is a high density plasma chamber such as an Ultima Chamber or a $D_xZ$ Chamber, both available from Applied Materials, Inc., of Santa Clara, Calif. A precursor process gas such as silane, dichlorosilane or tetraethylorthosilicate (TEOS) can be used to deposit the dielectric layer. The dielectric material deposited on the electrostatic chuck is removed during chamber cleaning processes performed periodically and must be redeposited prior to positioning another substrate on the electrostatic chuck. Redepositing of the dielectric layer after each chamber cleaning step is an advantage since a uniform surface which is not altered by the deposition processes or chamber cleaning processes is provided on the electrostatic chuck.

The present invention further provides a substrate processing system comprising a plasma chamber comprising a plasma zone, an electrostatic chuck comprising a wafer supporting surface for holding a substrate in the plasma zone, and a vacuum system. The processing system further comprises a source of one or more process gases, one or more RF generators coupled to the plasma chamber for generating a plasma in the plasma zone and a controller to provide computer control of the system. Process steps are selected by a memory coupled to the controller, the memory comprising a computer usable medium comprising a computer readable program code for selecting a process comprising the steps of cleaning the vacuum chamber with a plasma of one or more cleaning gases, depositing a layer of a dielectric material directly onto a substrate supporting surface of the electrostatic chuck, positioning a substrate on the substrate supporting surface, processing the substrate while held by the electrostatic chuck, and removing the substrate from the vacuum chamber.

The method of the invention can be used with any processing chamber that has an electrostatic chuck for gripping a substrate and components capable of depositing a uniform dielectric layer. A preferred processing chamber such as the HDP-CVD chamber or the $D_xZ$ Chamber are preferably mounted on a Centura® platform. The present invention will be described with reference to an HDP-CVD chamber. However, the present invention can be performed in a variety of chambers available from different equipment manufacturers.

The HDP-CVD processing chamber includes an electrode disposed in a ceramic electrostatic chuck and is capable of plasma enhanced deposition of a dielectric material. The platform is computer operated and includes program code which can be modified to enable precoating of the surface of the electrostatic chuck with a dielectric layer after each chamber clean prior to processing of wafers in the chamber.

Platform Components

FIG. 1 is a schematic top view of a Centura® platform which is programmed to precoat an electrostatic chuck with a dielectric material in accordance with the present invention. Substrates housed in a cassette 10 are introduced and withdrawn from the platform through a first slit valve in a first load lock chamber 12 or through a second slit valve in a second load lock chamber 14. A robot 16 having a blade 18 is located in a transfer chamber 20 to move a wafer 22 between various chambers 24, 26, 28 mounted on the transfer chamber 20. The chambers include a multi-slot cool down chamber 24, a wafer orienting chamber 26, and two HDP-CVD process chambers 28 each of which includes an electrostatic chuck as described in more detail below. A microprocessor controller 30 and associated software are provided to control processing and movement of substrates through the system.

Figure 2:
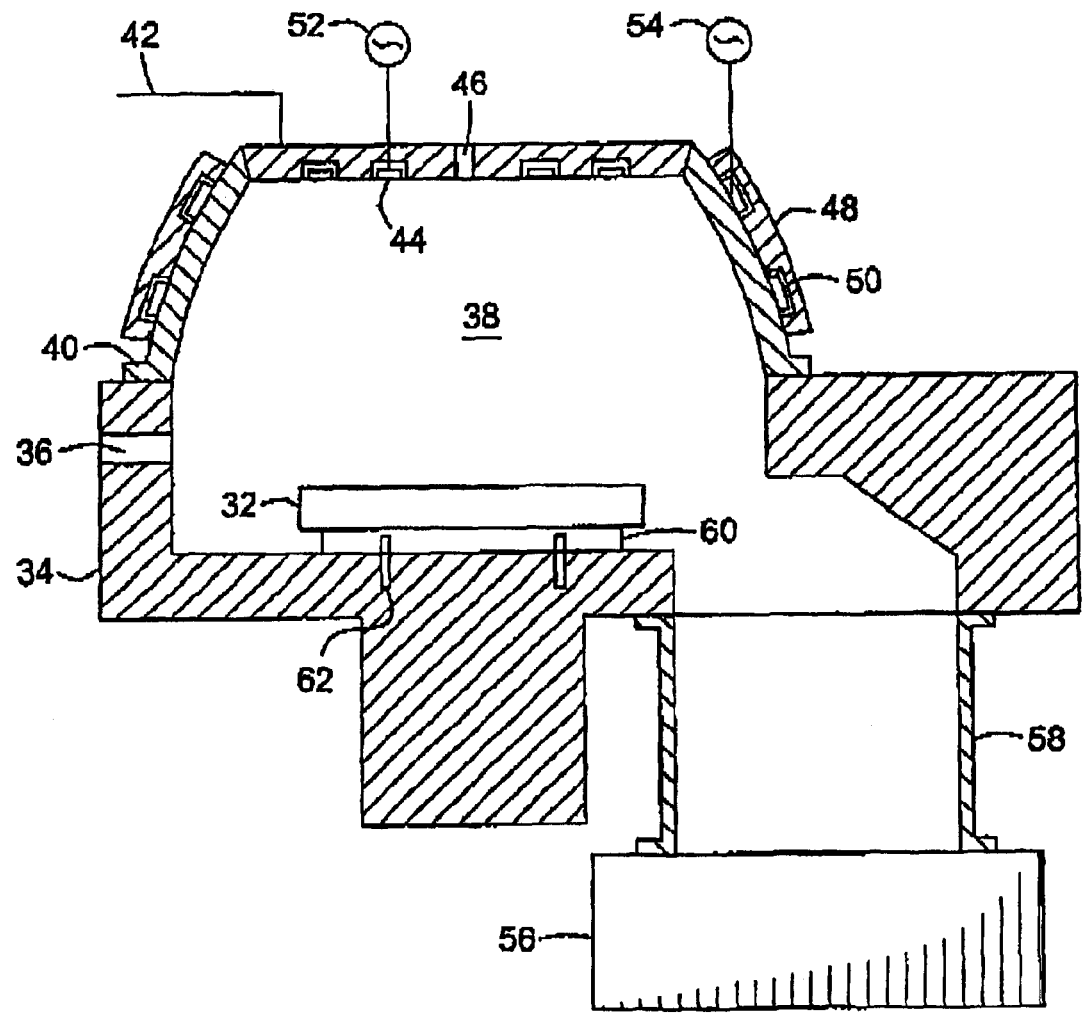
FIG. 2 is a schematic side view partially in section showing the layout of an HDP-CVD processing chamber included in the platform of FIG. 1.

FIG. 2 is a schematic side view of an HDP-CVD chamber 28 showing principally the coil geometry in relation to an electrostatic chuck 32. A chamber body 34 has one or more side gas inlets 36 for introducing one or more process gases into a plasma zone 38. A dome 40 is mounted on the chamber body 34 and supports a chamber lid 42 which has a recessed lower surface for receiving a top antenna coil 44. The chamber lid 42 may also have a central gas inlet 46 for introducing one or more process gases to the plasma zone 38. A side coil holder 48 is mounted around the side of the dome 40 and has a recessed inner surface for receiving a side antenna coil 50. An RF source 52 provides RF power to the top antenna coil 44 and a separate RF source 54 provides RF power to the side antenna coil 50. Alternatively, a single RF source may supply RF power through a splitter to both coils 44, 50. The dual coil arrangement, when properly tuned to a wafer being processed, can generate a uniform ion current across its surface.

Deposition gases are introduced into the chamber through both the side gas inlets 36 and the central gas inlet 46. A turbo pump 56, or other pumping system, exhausts gases out of the chamber through a valve assembly 58 to maintain a desired pressure in the chamber, typically about 0.5 milliTorr to about 50 milliTorr, during processing. The electrostatic chuck 32 is mounted on a pedestal 60 which is supported by the chamber body 34. Lift pins 62 move through passages in the pedestal 60 and electrostatic chuck 32 and rise to remove a substrate 22 from the robot blade 18 and then lower the substrate 22 onto the electrostatic chuck 32.

The chamber body 34 is preferably made of aluminum and the dome is preferably made of a ceramic material or other dielectric material which is transparent to RF energy.

The coils 44, 50 are preferably made of copper or other conductive metal. The electrostatic chuck is preferably made of a ceramic material, most preferably aluminum oxide ($Al_2O_3$) or aluminum nitride (AlN) which is doped with metallic impurities in order to render it more conductive to dissipate any charge build up occurring thereon.

Figure 3:
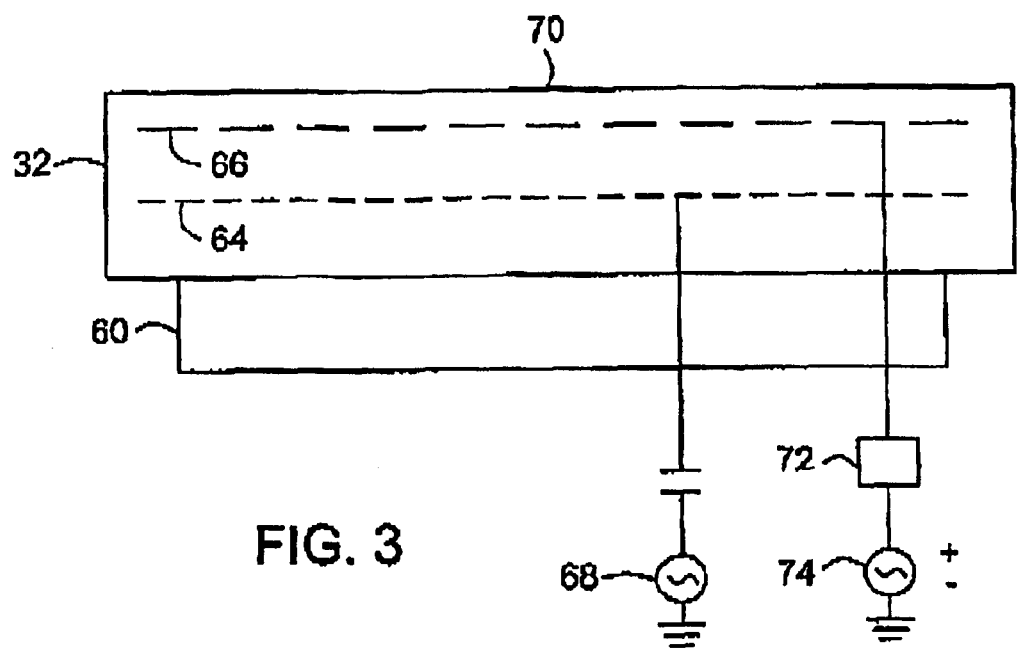
FIG. 3 is a schematic side view of the electrostatic chuck contained within the processing chamber of FIG. 2.

FIG. 3 is a schematic side view of the electrostatic chuck 32 showing an RF electrode 64 and a chucking electrode 66 embedded in the chuck. The RF electrode 64 is coupled to an RF source 68. The chucking electrode 66 can be a bipolar chucking electrode or a unipolar chucking electrode, as described in U.S. Pat. No. 5,315,473, to form an electric field which holds a substrate against a substrate receiving surface 70 on the electrostatic chuck 32. The chucking electrode is coupled through an RF filter 72 to a voltage source 74.

Precoating the Electrostatic Chuck

Figure 4:
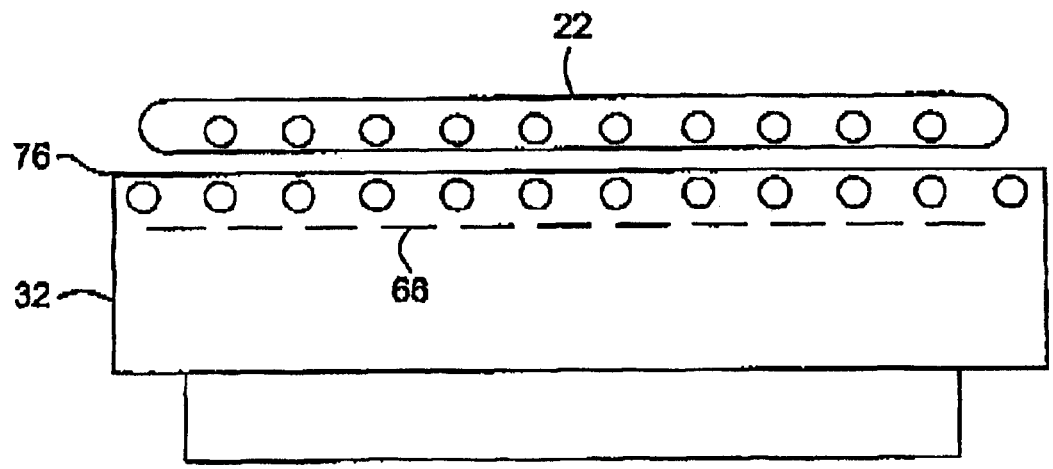
FIG. 4 is a schematic side view of a precoat layer of a dielectric material on the surface of the electrostatic chuck of FIG. 3.

In the method of the present invention, after a conventional chamber cleaning step, an in-situ chamber precoat step is performed to deposit a dielectric layer 76 on the substrate receiving surface 70 of the electrostatic chuck 32 as shown in FIG. 4. A high density silane plasma is preferably used to deposit a dielectric material, such as $SiO_2$, directly onto the substrate receiving surface 70. Precursor process gases such as silane, dichlorosilane and TEOS can be used to advantage in the present invention. However, other dielectric deposition processes are contemplated herein. This dielectric layer 76 is completely removed by subsequent chamber cleaning processes and must be redeposited after each chamber cleaning.

The precoat layer 76 preferably has a thicknesses of between about 1000A and about 5000A, with the lower limit determined by the chucking voltage used. Greater thicknesses essentially insulate the doped ceramic material in the electrostatic chuck and may prevent the residual charge on the wafer from dissipating to the electrostatic chuck 32. However, other thicknesses may be used depending on the chucking and biasing voltages used and the gripping force needed to secure a wafer during processing.

Rather than having to use square wave voltages of 500 to 1000 volts peak value, as in the '473 patent, deposition of the dielectric, preferably $SiO_2$, allows the use of square wave voltages of about 250 volts peak to reliably grip the wafer. This precoat step has been found to be especially effective at chuck surface temperatures of greater than 150° C. In this temperature range, the pinhole density throughout the precoat layer 76 is lower.

System Controller

The load lock chambers 12, 14, the processing chambers 24, 26, 28, and the transfer chamber 20 are controlled by the system controller 30. The processing platform includes analog assemblies such as mass flow controllers (MFCs) and RF generators that are controlled by the system controller 30 which executes system control software stored in a memory, which in the preferred embodiment is a hard disk drive. Motors and optical sensors are used to move and determine the position of movable mechanical assemblies such as the valve assembly 58 and the pump 56 for maintaining a vacuum in the HDP-CVD chamber 28.

The system controller 30 controls all of the activities of the substrate processing platform and a preferred embodiment of the controller 30 includes a hard disk drive, a floppy disk drive, and a card rack. The card rack contains a single board computer (SBC), analog and digital input/output boards, interface boards and stepper motor controller boards. The system controller conforms to the Versa Modular Europeans (VME) standard which defines board, card cage, and connector dimensions and types. The VME standard also defines the bus structure having a 16-bit data bus and 24-bit address bus.

The system controller 30 operates under the control of a computer program stored on the hard disk drive. The computer program dictates the sequence and timing of process steps, mixture of gases, RF power levels, and other parameters of a particular process. The interface between a user and the system controller 30 is typically a CRT monitor and light pen. In the preferred embodiment, a second monitor is included in the system controller 30, the first monitor being mounted in the clean room wall for the operators and the other monitor behind the wall for the service technicians. Both monitors simultaneously display the same information but only one light pen is enabled. The light pen detects light emitted by CRT display with a light sensor in the tip of the pen. To select a particular screen or function, the operator touches a designated area of the display screen and pushes the button on the pen. The touched area changes its highlighted color, or a new menu or screen is displayed, confirming communication between the light pen and the display screen.

The process of the invention can be implemented using a computer program product 410 that runs on, for example, the system controller 30. The computer program code can be written in any conventional computer readable programming language such as for example 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

Figure 5:
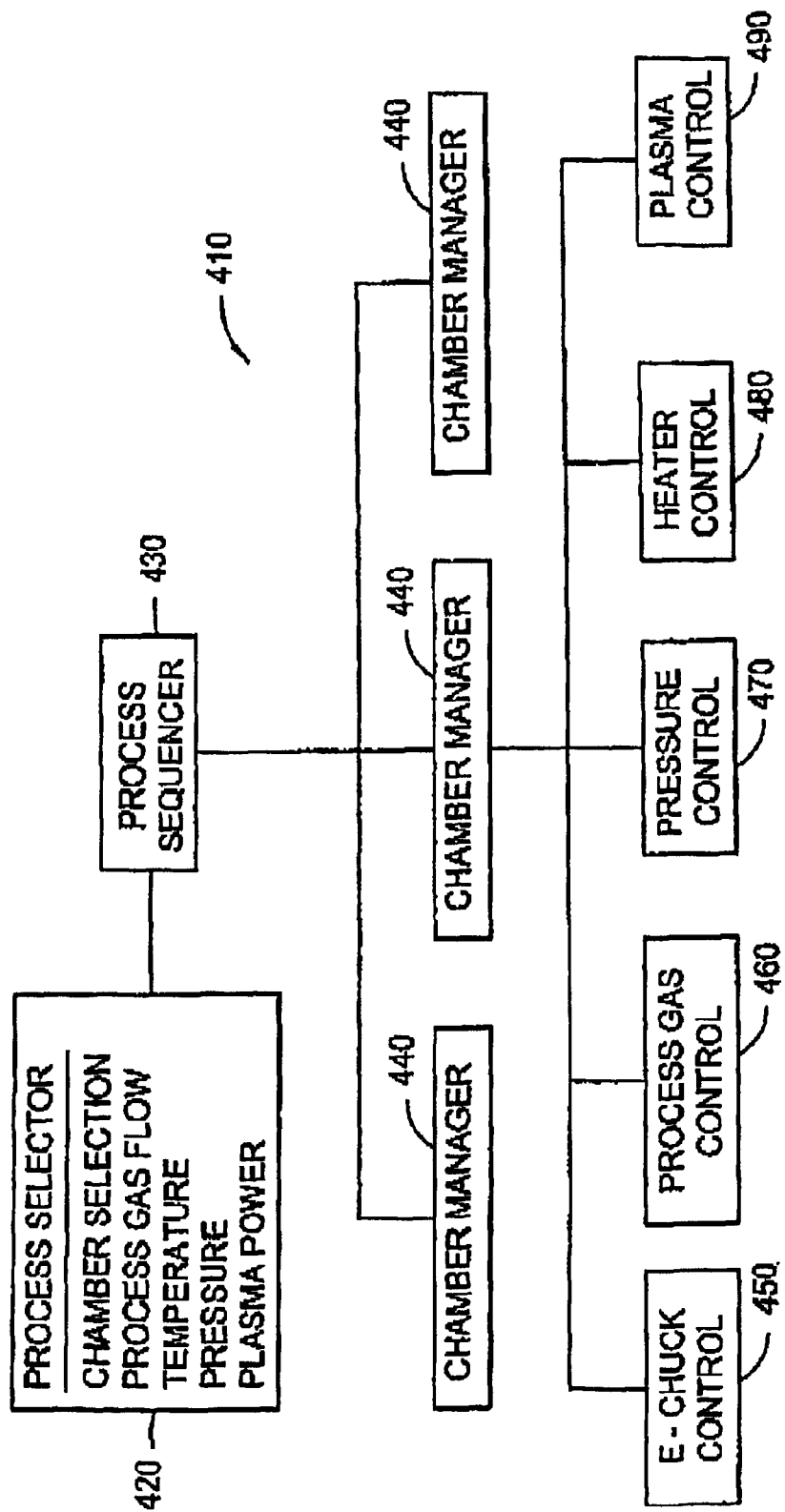
FIG. 5 is a flow chart of a process control computer program product used in conjunction with the wafer processing platform of FIG. 1.

FIG. 5 shows an illustrative block diagram of the hierarchical control structure of the computer program 410. A user enters a process set number and process chamber number into a process selector subroutine 420 in response to menus or screens displayed on the CRT monitor by using the light pen interface. The process sets are predetermined sets of process parameters necessary to carry out specified processes, and are identified by predefined set numbers. The process selector subroutine 420 identifies (I) the desired process chamber, and (ii) the desired set of process parameters needed to operate the process chamber for performing the desired process. The process parameters for performing a specific process relate to process conditions such as, for example, process gas composition and flow rates, temperature, pressure, plasma conditions such as RF bias power levels and magnetic field power levels, cooling gas pressure, and chamber wall temperature and are provided to the user in the form of a recipe. The parameters specified by the recipe are entered utilizing the light pen/CRT monitor interface.

The signals for monitoring the process are provided by the analog input and digital input boards of system controller and the signals for controlling the process are output on the analog output and digital output boards of the system controller 30.

A process sequencer subroutine 430 comprises program code for accepting the identified process chamber and set of process parameters from the process selector subroutine 420, and for controlling operation of the various process chambers. Multiple users can enter process set numbers and process chamber numbers, or a user can enter multiple process chamber numbers, so the sequencer subroutine 430 operates to schedule the selected processes in the desired sequence. Preferably the sequencer subroutine 430 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer subroutine 430 can be designed to take into consideration the present condition of the process chamber being used in comparison with the desired process conditions for a selected process, or the "age" of each particular user entered request, or any other relevant factor a system programmer desires to include for determining the scheduling priorities.

Once the sequencer subroutine 430 determines which process chamber and process set combination is going to be executed next, the sequencer subroutine 430 causes execution of the process set by passing the particular process set parameters to a chamber manager subroutine 440 which controls multiple processing tasks in a process chamber according to the process set determined by the sequencer subroutine 430. For example, the chamber manager subroutine 440 comprises program code for controlling sputtering and CVD process operations in the HDP-CVD process chamber 28. The chamber manager subroutine 440 also controls execution of various chamber component subroutines which control operation of the chamber component necessary to carry out the selected process set. Examples of chamber component subroutines are electrostatic chuck control subroutine 450, process gas control subroutine 460, pressure control subroutine 470, heater control subroutine 480, and plasma control subroutine 490. Those having ordinary skill in the art would readily recognize that other chamber control subroutines can be included depending on what processes are desired to be performed in the process chamber.

In operation, the chamber manager subroutine 440 selectively schedules or calls the process component subroutines in accordance with the particular process set being executed. The chamber manager subroutine 440 schedules the process component subroutines similarly to how the sequencer subroutine 430 schedules which process chamber and process set is to be executed next. Typically, the chamber manager subroutine 440 includes steps of monitoring the various chamber components, determining which components needs to be operated based on the process parameters for the process set to be executed, and causing execution of a chamber component subroutine responsive to the monitoring and determining steps.

Operation of particular chamber components subroutines will now be described with reference to FIG. 5. The electrostatic chuck control subroutine 450 comprises program code for controlling chamber components that are used to position, grip, and release the wafer 22 on the wafer receiving surface 70 of the electrostatic chuck 32. When a wafer is loaded into the process chamber 28, the lift pins 62 lift the wafer from the robot blade 18 and lower the wafer onto the wafer receiving surface 70. In operation, the electrostatic chuck control subroutine 450 controls the chucking electrode 66 in response to process set parameters that are transferred from the chamber manager subroutine 440.

The process gas control subroutine 460 has program code for controlling process gas composition and flow rates. The process gas control subroutine 460 controls the open/close position of the safety shut-off valves, and also ramps up/down the mass flow controllers to obtain the desired gas flow rate. The process gas control subroutine 460 is invoked by the chamber manager subroutine 440, as are all chamber components subroutines, and receives from the chamber manager subroutine process parameters related to the desired gas flow rates. Typically, the process gas control subroutine 460 operates by opening the gas supply lines, and repeatedly (i) reading the necessary mass flow controllers, (ii) comparing the readings to the desired flow rates received from the chamber manager subroutine 440, and (iii) adjusting the flow rates of the gas supply lines as necessary. Furthermore, the process gas control subroutine 460 includes steps for monitoring the gas flow rates for unsafe rates, and activating the safety shut-off valves when an unsafe condition is detected.

In some processes, an inert gas such as argon is flowed into the chamber to stabilize the pressure in the chamber before reactive process gases are introduced into the chamber. For these processes, the process gas control subroutine 460 is programmed to include steps for flowing the inert gas into the chamber for an amount of time necessary to stabilize the pressure in the chamber, and then the steps described above would be carried out. Additionally, when a process gas it to be vaporized from a liquid precursor, for example TEOS, the process gas control subroutine 460 would be written to include steps for vaporizing the liquid precursor in a delivery gas such as helium. For this type of process, the process gas control subroutine 460 regulates the flow of the delivery gas and the liquid precursor. As discussed above, the desired process gas flow rates are transferred to the process gas control subroutine 460 as process parameters. Furthermore, the process gas control subroutine 460 includes steps for obtaining the necessary delivery gas flow rate and liquid precursor flow rate by accessing a stored table containing the necessary values for a given process gas flow rate. Once the necessary values are obtained, the delivery gas flow rate and the precursor liquid flow rate are monitored, compared to the necessary values, and adjusted accordingly.

The pressure control subroutine 470 comprises program code for controlling the pressure in the chamber by regulating the size of the opening of the valve assembly 58. The size of the opening of the throttle valve is set to control the chamber pressure to the desired level in relation to the total process gas flow, size of the process chamber, and pumping set point pressure. When the pressure control subroutine 470 is invoked, the desired, or target pressure level is received as a parameter from the chamber manager subroutine 440. The pressure control subroutine 470 operates to measure the pressure in the chamber by reading one or more conventional pressure manometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, the pressure control subroutine 470 can be written to open or close the throttle valve to a particular opening size to regulate the chamber to the desired pressure.

The heater control subroutine 480 comprises program code for controlling the temperature of resistive heat coils that are used to heat various chamber surfaces. The heater control subroutine 480 is also invoked by the chamber manager subroutine 440 and receives a target, or set point, temperature parameter. The heater control subroutine 480 measures the temperature by measuring voltage output of a thermocouple, compares the measured temperature to the set point temperature, and increases or decreases current applied to the heat coil to obtain the set point temperature. The temperature is obtained from the measured voltage by looking up the corresponding temperature in a stored conversion table, or by calculating the temperature using a fourth order polynomial. The heater control subroutine 480 gradually controls a ramp up/down of current applied to the resistive heat coil. The gradual ramp up/down increases the life and reliability of the heat coils. Additionally, a built-in-fail-safe mode can be included to detect process safety compliance, and can shut down operation of the heat coil if the process chamber is not properly set up.

The plasma control subroutine 490 comprises program code for setting the RF bias voltage power level applied to the process electrodes in the chamber, and optionally, to set the level of the magnetic field generated in the chamber. Similar to the previously described chamber component subroutines, the plasma control subroutine 490 is invoked by the chamber manager subroutine 440.

Figure 6:
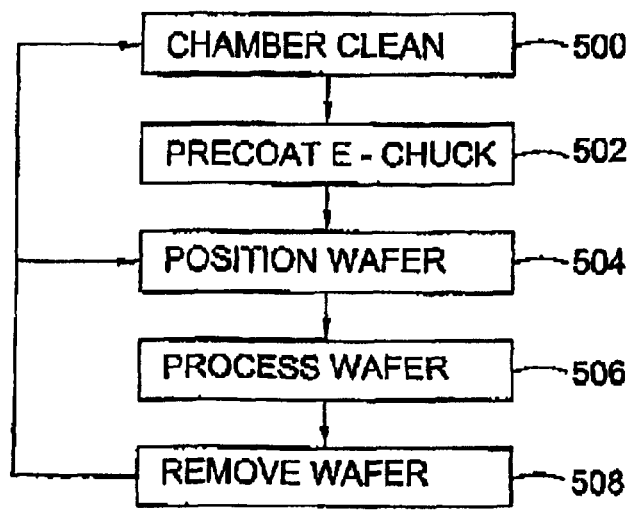
FIG. 6 is a flow chart illustrating preferred process steps undertaken in precoating the electrostatic chuck with a dielectric material before processing a wafer.

Referring to FIG. 6, the chamber manager 440 for the HPD-CVD chambers 28 include program code which provides for a chamber cleaning 500 to be followed by precoating 502 of the electrostatic chuck with a dielectric material such as HDP-CVD deposition of $SiO_2$ as described above. After precoating the electrostatic chuck 32, the program code provides for positioning 504 a wafer on the electrostatic chuck 32 and processing 506 the wafer in a manner known to persons skilled in formation of integrated circuits on the wafers. For example, $SiO_2$ can be simultaneously deposited on the wafer and sputtered to the HDP-CVD chamber walls to enhance gap filling of sub 0.5 micron devices having high aspect ratio lines or vias wherein the ratio of gap height to width is >1.2:1. The program code then provides for removing 508 the wafer from the chamber. A large number of wafers can be positioned 504, processed 506, and removed 508 before returning to the chamber cleaning step 500.

The above CVD system description is mainly for illustrative purposes, and other plasma CVD equipment such as electrode cyclotron resonance (ECR) plasma CVD devices or the like may be employed in the processing platform, with or without a system controller. Additionally, variations of the above described system such as variations in electrostatic chuck design and location of RF electrodes are possible.

While the foregoing is directed to the preferred embodiments of the present invention, other and further embodiments of the invention may be devised without departing from the basic scope thereof, and the scope thereof is determined by the claims which follow.

What is claimed is:

1. A method of processing a substrate in a process chamber, comprising:

depositing a dielectric layer on a wafer supporting surface of an electrostatic chuck disposed in the process chamber;

positioning the substrate in the process chamber on the dielectric layer deposited on the wafer supporting surface of the electrostatic chuck;

processing the substrate while held by the electrostatic chuck;

removing the substrate from the process chamber; and removing the dielectric layer on the wafer supporting surface by exposing the wafer supporting surface to one or more cleaning gases.

2. The method of claim 1, wherein the dielectric layer is an oxide layer having a thickness of from about 1000 Å to about 15000 Å.

3. The method of claim 2, wherein the oxide layer is deposited using a plasma at a chamber pressure from about 0.5 milliTorr to about 50 milliTorr.

4. The method of claim 3, wherein the electrostatic chuck comprises a ceramic material and is maintained at a temperature greater than about 150° C. when depositing the dielectric material.

5. The method of claim 4, wherein the ceramic material comprises a dopant material.

6. The method of claim 1, further comprising redepositing the dielectric layer on the wafer supporting surface after removing the dielectric layer.

7. A method of processing a substrate in a process chamber, comprising:

positioning the substrate in the process chamber on wafer supporting surface of an electrostatic chuck disposed in the process chamber, wherein the wafer supporting surface comprises a dielectric material;

processing the substrate while held by the electrostatic chuck;

removing the substrate from the process chamber;

exposing the wafer supporting surface to one or more cleaning gases;

removing at least a portion of the dielectric material on the wafer supporting surface; and depositing a dielectric layer comprising silicon oxide on a wafer supporting surface of the electrostatic chuck.

8. The method of claim 7, further comprising positioning a second substrate in the process chamber on wafer supporting surface of the electrostatic chuck after depositing a dielectric layer comprising silicon oxide on a wafer supporting surface of an electrostatic chuck.

9. The method of claim 7, further comprising positioning and processing a plurality of substrates prior to exposing the wafer supporting surface to one or more cleaning gases.

10. The method of claim 7, wherein the silicon oxide layer has a thickness of from about 1000 Å to about 5000 Å.

11. The method of claim 7, wherein the electrostatic chuck comprises a ceramic material having a supporting surface formed thereon.

12. The method of claim 11, wherein the ceramic material comprises a dopant material.

13. The method of claim 7, wherein the silicon oxide layer is deposited by a high density plasma of a precursor selected from the group of silane, diclorosilane, and TEOS.

14. The method of claim 7, wherein the processing chamber is a high density plasma processing chamber.

* * * * *